(12) United States Patent
Rubahn et al.

(10) Patent No.: US 8,034,400 B2
(45) Date of Patent: Oct. 11, 2011

(54) SOFT-LIFT OFF OF ORGANIC NANOFIBERS

(75) Inventors: Horst-Günter Rubahn, Handewitt (DE); Frank Balzer, Flensburg (DE)

(73) Assignee: Nanofiber A/S, Kobenhavn K. (DK)

( * ) Notice: Subject to any disclaimer, the term of this patent is extended or adjusted under 35 U.S.C. 154(b) by 1083 days.

(21) Appl. No.: 11/718,299

(22) PCT Filed: Nov. 1, 2005

(86) PCT No.: PCT/DK2005/000697
§ 371 (c)(1),
(2), (4) Date: Jul. 25, 2007

(87) PCT Pub. No.: WO2006/048015
PCT Pub. Date: May 11, 2006

(65) Prior Publication Data
US 2009/0057614 A1   Mar. 5, 2009

(30) Foreign Application Priority Data

Nov. 1, 2004   (DK) ................................ 2004 01676

(51) Int. Cl.
*B05D 5/06* (2006.01)
(52) U.S. Cl. .......................................... 427/74; 427/212
(58) Field of Classification Search .................. 427/74, 427/212
See application file for complete search history.

(56) References Cited

U.S. PATENT DOCUMENTS

| | | | |
|---|---|---|---|
| 5,981,305 A | 11/1999 | Hattori | |
| 6,770,337 B2 | 8/2004 | Debe et al. | |
| 6,969,690 B2 * | 11/2005 | Zhou et al. | 438/787 |
| 2004/0192070 A1 | 9/2004 | Tateishi | |
| 2006/0024499 A1 * | 2/2006 | Kim et al. | 428/401 |

FOREIGN PATENT DOCUMENTS

| | | |
|---|---|---|
| EP | 1 407 816 A1 | 4/2004 |
| EP | 1 413 550 A1 | 4/2004 |
| WO | WO 00/73204 A1 | 12/2000 |
| WO | WO 01/80286 A2 | 10/2001 |
| WO | WO 01/92150 A1 | 12/2001 |
| WO | WO 02/086200 A1 | 10/2002 |
| WO | WO 03/083128 A2 | 10/2003 |
| WO | WO 2004/043858 | 5/2004 |
| WO | WO 2004/087434 A1 | 10/2004 |

OTHER PUBLICATIONS

Balzer et al., "Dipole Assited self-assembly of light-emitting p-nP needles on mica," Appl. Phys. Letters, vol. 79, 23, pp. 3860-3862 (2001).*

(Continued)

*Primary Examiner* — Michael Cleveland
*Assistant Examiner* — Robert Vetere
(74) *Attorney, Agent, or Firm* — Stephen A. Bent; Foley & Lardner LLP (57) ABSTRACT

The invention relates to a method of releasing an ensemble of nanofibers from a dielectric substrate as well as to applications of the method. The organic nanofibers are grown on the substrate and can be released by first providing a polar liquid to a surface of the substrate and subsequently supplying energy to the combined system of nanofibers and liquid. The release may preferably be followed by transferring the released nanofibers to another substrate for application of the nanofibers, including alignment and/or structuring of the nanofibers. The applications includes light emitting, guiding and sensing applications.

12 Claims, 4 Drawing Sheets

OTHER PUBLICATIONS

Tomihari, WO01/92150, machine translation.*
Balzer et al., "Dipole-assisted self-assembly of light-emitting p-nP needles on mica," Appl. Phys. Letters, vol. 79, No. 23, pp. 3860-3862 (2001).*
Yu et al., "Morphology and photoluminescent properties of poly(p-phenylene) nanofibre arrays fabricated by template method," Materals Sci. and Engr. A325, pp. 215-220 (2002).*
Tomihari, WO01/92150, machine translation, May 2001.*
Bozhang Yu et al., "Morphology and photoluminescent properties of poly(p-phenylene) nanofibre arrays fabricated by template method", Materials Science and Engineering A325 (2002) pp. 215-220.
F. Balzer et al., "Chain-length dependent para-phenylene film- and needle-growth on dielectrics", Surface Science 548, (2004), pp. 170-182.
D.H. Park et al., "Characteristics and photoluminescence of nanotubes and nanowires of poly (3-methylthiophene)", Applied Physics Letters, 86, (2005), 113116-1-113116-3.

* cited by examiner

SOFT-LIFT OFF OF ORGANIC NANOFIBERS

FIELD OF THE INVENTION

The invention relates to a method of releasing an ensemble of nanofibres from a template substrate as well as to applications of the method, and in particular to releasing organic nanofibres from a dielectric substrate.

BACKGROUND OF THE INVENTION

The ongoing rapid miniaturisation of optoelectronics has led to an increased interest in generation, characterisation and interconnection of optoelectronic elements with characteristic dimensions in the sub-micrometer or nanometer length scale regime. The requirements of the optically active element(s) in a sub-micro- or nanoscale optoelectronic component include such features as an easy optical tunability, a strong luminescence efficiency, flexibility in the molecular basis elements and that light should be generated or propagate in a predefined way. Organic optically active elements may fulfil such requirements.

A difficulty is that normally it is impossible, inconvenient or economically unfeasible to form the organic sub-micro- or nanoscale optically active elements and components directly on a desired substrate.

A solution to this is to form the optically active element on a different substrate—a formation substrate or template—and subsequently transfer the element to the desired substrate. Known techniques for releasing and transferring sub-micro- or nanoscale elements include ablation, adhesive lift-off techniques, removing the formation substrate from the backside by milling, such as ion milling, chemical dissolution of the formation substrate. However, these methods may require multiple steps and may produce excessive waste materials or may simply not work, e.g. because the optically active elements are not transferred in an unaltered way.

Figure 2:
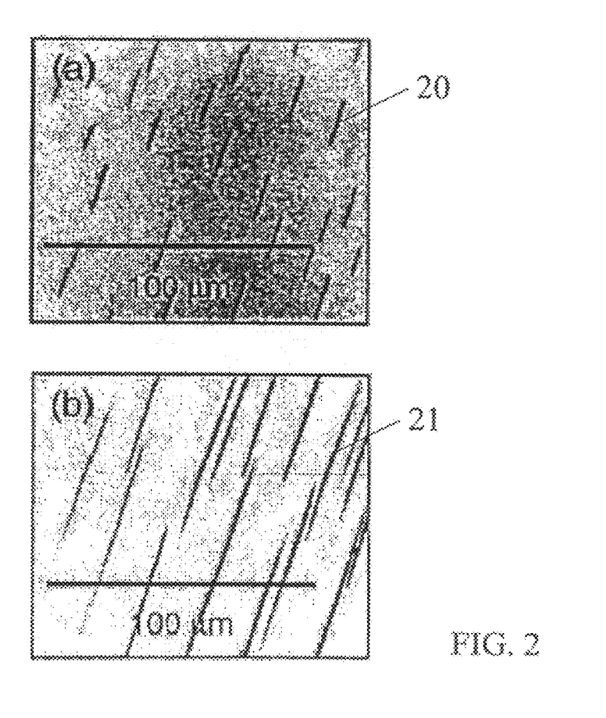
FIG. 2 shows two microscope images of aligned nanofibres.
Figure 3:
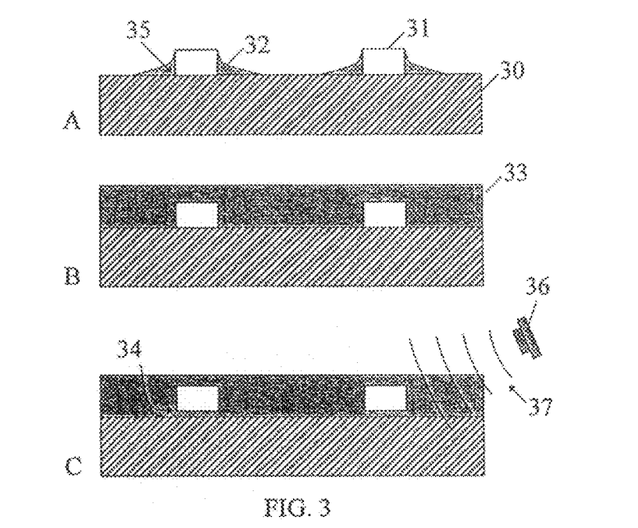
FIG. 3 illustrates schematically the releasing process of the nanofibres from the template substrate.
Figure 4:
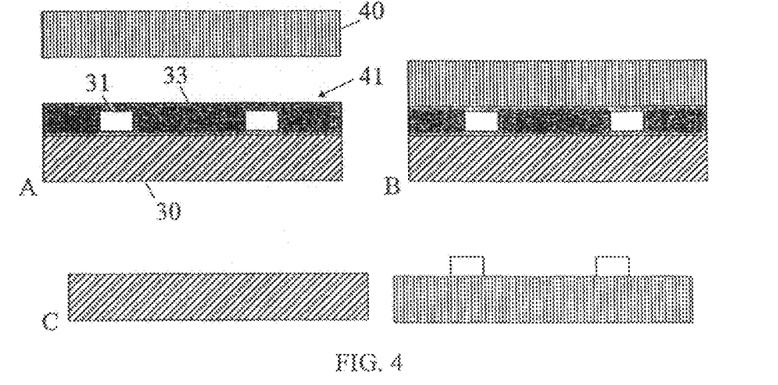
FIG. 4 illustrates schematically an embodiment of process steps of a transferring of the released nanofibres from the template substrate to a target substrate.
Figure 5:
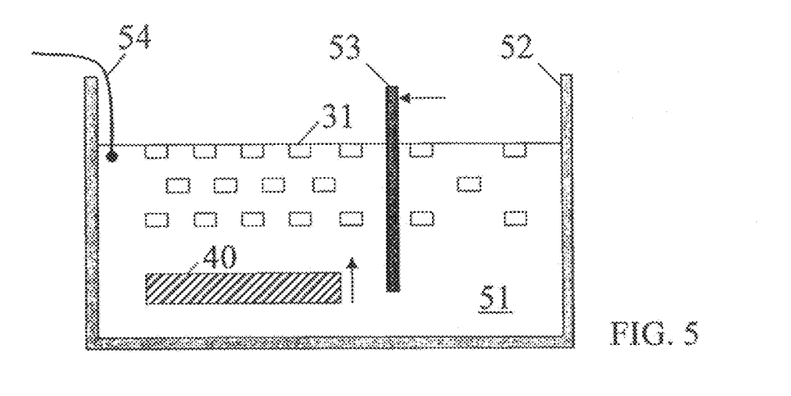
FIG. 5 illustrates schematically an embodiment of a transfer process of the released nanofibres to a liquid solution.
Figure 6:
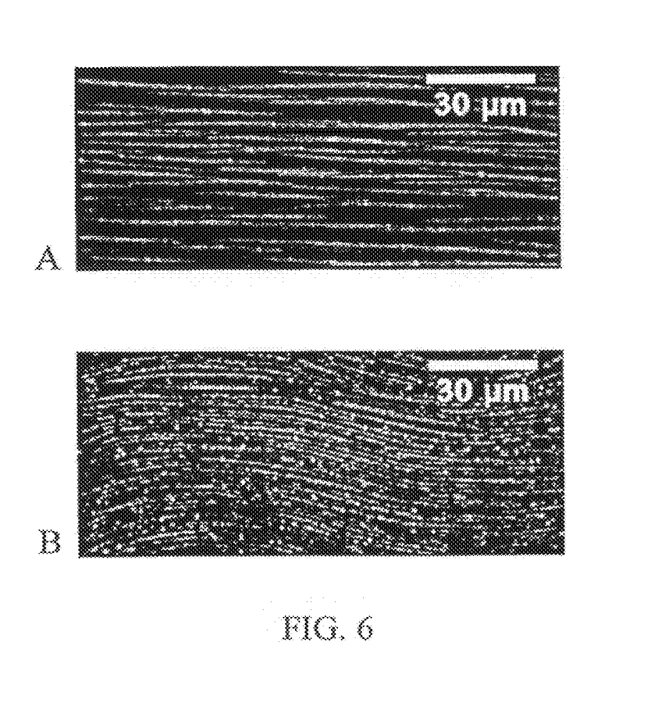
FIG. 6 shows images of nanofibres in a liquid solution.

WO 01/92150 describes a method for transferring carbon nanotubes to a substrate. The method can be understood from FIGS. 2 through 6 as follows:
  FIGS. 2+3: A lump of carbon nanotubes 1a is dissolved in a solvent 4 by the application of a supersonic wave 5, to create a carbon nanotube-solution 6. The supersonic wave has:
    frequency [20-200 kHz]
    amplitude [0.5-50 μm]
    for a time of [0.1-10 hours]
  FIG. 4: The carbon nanotube-solution 6 is filtered through filer 7 whereby a carbon nanotube thin film 1 is created on filter 7.
  FIGS. 5+6: A binder layer 3 is formed on the thin film 1, and the structure is turned upside-down on a substrate 2. The filter 7 can now be torn off and the binder layer 3 can be dissolved by heat treatment, resulting in the formation of a carbon nanotube thin film 1 on substrate 2.

Hence WO 01/92150 relates to the transfer of a lump of carbon nanotubes to a substrate.

The inventors of the present invention have appreciated that an improved method of releasing sub-micro- or nanoscale elements from a substrate, and thereby facilitating transferring of sub-micro- and nanoscale elements is of benefit, and has in consequence devised the present invention.

SUMMARY OF THE INVENTION

The present invention seeks to provide an improved lift-off procedure for releasing an ensemble of organic nanofibres from a template substrate and transferring the ensemble of organic nanofibres to a target substrate. It is an object that the lift-off be performed in a way so that at least one of the following properties of the organic nanofibres: morphology, optical, electronic and/or mechanical are maintained in a substantially unaltered form.

Preferably, the invention alleviates or mitigates one or more of the above or other disadvantages singly or in any combination. Accordingly there is provided, in a first aspect, a method of releasing an ensemble of organic nanofibres from a template substrate, the method comprising the steps of:
a) providing a dielectric template substrate,
b) growing organic nanofibres on the template substrate, the nanofibres being elongate or bent aggregates of organic molecules,
c) releasing the nanofibres from the template substrate by first providing a polar liquid to a surface of the template substrate so that the liquid is in liquid contact with the surface and the nanofibres, and subsequently supplying energy to the combined system of nanofibres and liquid.

The dielectric substrate may be any type of substrate suitable for growing an ensemble of organic nanofibres. The substrate may have a polar surface, i.e. a surface which maintains an electrical field. Such substrates may be unstable in ambient conditions and consequently at least one of the steps required in the preparation of the template substrate and the subsequent growth of the nanofibres may be conducted in a vacuum condition, such as in a pressure below $10^{-5}$ torr, such as below $10^{-7}$ torr, or even lower. The template substrate may be a mica substrate, such as a mica substrate of the muscovite type. However, the template substrate may be any type of polar substrate such as surfaces maintaining a non-zero electrical charge and a non-zero surface dipole moment, e.g. such as surfaces of the {111}-terminated rocksalt crystals, the {0001}-terminated wurtzite crystals, the {110}-terminated fluorite crystals, etc.

The organic nanofibres may be the resulting structure of a growth process, where the nanofibres are build up of individual organic molecules. The individual organic molecules may be molecules with a π-electronic configuration. The organic molecules may be of the type of para-phenylene oligomers or functionalised para-phenylene oligomers.

The organic nanofibres may have a mean lengths in the range of 10 to 100 microns or even longer. The cross-sectional width may be a few hundred nanometers and a cross-sectional height of approximately 100 nanometer. The shape of the cross-sectional area may be generally rectangular or quadratic. However, any cross-sectional shape may be envisioned.

The polar liquid provided to the surface of the substrate may wet the entire surface or may at least wet the regions abutting the nanofibres. The liquid may, but need not to, cover the individual nanofibres. The polar liquid may be such a polar liquid as water or methanol, or any liquid which has a finite dipole moment, such as a dipole moment larger than 1 Debye, larger than 1.5 Debye, larger than 1.75 Debye, larger than 2 Debye or even larger.

Energy is supplied to the combined system of nanofibres, liquid and template substrate surface. The energy may be supplied in such a way that energy is at least deposited in a contact region between the individual nanofibres and the template substrate. The energy may be provided by means of electromagnetic radiation, such as in the form of ultra-violet (UV) light, e.g. by means of an UV light source with an irradiance in the range of 0.1-5 W/cm$^2$, such as 0.1-3 W/cm$^2$, such as 0.1-1 W/cm$^2$. The emitting light may be light with wavelengths in the UV or near-UV wavelength range, such as in the range 300-500 nm. The energy may be supplied to the sample between a few seconds and a few hundred seconds. The energy may also be supplied by acoustic waves such as ultrasound.

The lift-off procedure is preferably followed by transferring and lay-down of the nanofibres to a target substrate. The transferring and lay-down may be carried out by different approaches as described in the following sections.

The method may further comprise the subsequent steps of:
bringing a target substrate into close contact with the template substrate, and
separating the two substrates, whereby the nanofibres can be transferred to the target substrate.

The close contact may be such contact where short-range atomic or molecular attraction arises between the template and target substrate. Upon separation of the two substrates the organic nanofibres may be transferred from the template to the target substrate. The target substrate may be wetted by the polar liquid before the target substrate and the template substrate are brought into contact.

The target substrate may be any desired substrate, such as a semiconductor substrate, e.g. a silicon substrate, a GaAs-substrate, an InP-substrate, etc. However, the target substrate may also be an insulator substrate, such as an alumina substrate, a silicasubstrate, a glass substrate, etc. The target substrate may also be a metal substrate, an oxide substrate, such as an ITO-substrate, etc.

The method may, and as an alternative to the above subsequent step, include the following step:
bringing the target substrate into close contact with the template substrate before supplying the energy,
separating the two substrates after supplying the energy, whereby the nanofibres can be transferred to the target substrate.

Thus the nanofibres may be transferred to a target substrate either by supplying energy before the template substrate and the target substrate are contacted, or by supplying energy after the substrates have been contacted, but before the substrates are separated. Energy may be supplied in the contact region between the substrates by using substrates, either template, target or both, which are at least partly transparent to the type of energy supplied.

The method may, as another alternative to the above subsequent step further comprise the step of:
applying additional liquid to the template substrate to transfer the nanofibres to a liquid solution.

The additional liquid may be provided by providing a liquid flow to the template substrate to "wash off" the nanofibres, e.g. by means of a liquid jet. The nanofibres may be stored in the liquid solution, a non-degrading storage means of the nanofibres is thereby provided.

The geometrical orientation of the nanofibres may be altered in the washing off process. However, the nanofibres may be reconfigured in the liquid solution. The reconfiguration may be obtained by placing the nanofibres between two objects, the objects being capable of changing their mutual distance of separation, and moving the objects closer together until a predetermined distance of separation is obtained. The objects may be such objects as thin plates or sheets either automated or mechanically operable, e.g. movable in a side-by-side manner. The same method may be applied to alter the distribution of either the released nanofibres on the template substrate, or the transferred fibres on the target substrate. The objects may instead be placed on the surface of the substrate and moved together.

The predetermined distance may be determined by monitoring the liquid pressure in a liquid surface area or volume between the two objects, and be determined as the distance where a liquid pressure increase occurs. The liquid pressure may rise at a point where the density of the organic nanofibres in the liquid solution is such that adjacent nanofibres start to repel each other. The predetermined distance may alternatively be determined by monitoring a mean separation between the nanofibres, e.g. by means of a microscope and be determined as the distance where a specific mean distance is obtained. The predetermined distance may also be determined from a known relation between separation of the movable objects and a desired density, separation, etc. of the nanofibres.

The nanofibres in the liquid solution may be transferred to a target substrate. The transferring may be obtained by bringing the target substrate into contact with the liquid solution, e.g. by immersing the target substrate in the liquid solution.

The individual or an ensemble of nanofibres on the target substrate may be contacted at one or more sections to electrode pads. The one or more sections may be such sections as the end sections of the nanofibres. The contacting may be obtained in connection with, or as a result of, a lithographic process. The electrode pads may be made of any suitable material, such as a conducting or semiconducting material.

The method may further comprise the subsequent steps of:
depositing an encapsulation layer onto the nanofibres, and
removing the encapsulation layer holding the nanofibres from the template substrate.

The encapsulation layer may be a layer of organic or inorganic molecules, and is used to lift-off the nanofibres. The encapsulation layer may then be applied to a target substrate and dissolved, whereby the transfer is completed.

The method may further comprise the step of aligning the nanofibres while in solution, i.e. during or between the lift-off and lay-down procedures.

The step of aligning the nanofibres may comprise the sub-steps of:
placing the nanofibres between two electrodes capable of generating an electromagnetic field between the electrodes, and
applying an AC-field between the electrodes.

The alignment of the nanofibres may be done after the nanofibres have been released on the template substrate or after the nanofibres have been transferred to the target substrate. The alignment may be performed in order to adjust the pattern of the nanofibres to a final product or in connection with an intermediate step of fabricating a final product.

The alignment may be obtained using an AC-field with a field strength between $10^4$ V/m and $10^6$ V/m, such as a few $10^5$ V/m, and a frequency of a few hundred kHz up to a few MHz.

The organic nanofibres may be optically active elements, as they may emit light, e.g. by running a current along the fibre or by a fluorescence process following light or electron exposure of the nanofibres. The organic nanofibres may be optically active in the visible or near visible wavelength range, such as in the wavelength range of 300-600 nm, or more specific in the range of 370-500 nm, corresponding substantially to blue light. The organic nanofibres may, however, be optically active in any visible or near visible wavelength range, as determined by the electronic structure of the molecular constituents of the nanofibres.

The method of releasing and transferring the nanofibres from a template substrate to a target substrate as disclosed, ensures that at least one, and possibly more, or even all, physical properties of the individual or ensemble of nanofibres are substantially unaltered in the release and/or transferring process. For example, the optical and morphological properties of individual or an ensemble of nanofibres may be conserved during transfer. However, also electronic and mechanical properties may be conserved in the transfer process.

The method of the present invention may be applied a number of times so as to provide a target substrate with layers of nanofibres. Additional process steps may be performed in between the multiple transfer steps of the present invention, such as lithographic steps, deposition steps, etc. In a preferred embodiment, the growth of the nanofibres on the template substrate may be patterned, e.g. so that some regions contain nanofibres and others are void. The patterning may be transferred to the target substrate to provide a functionality in a resulting device. It is evident that only some of the transferring approaches described in the above will conserve the patterning.

According to further aspects, the invention may provide devices such as light emitting devices, light sensing devices, light guiding devices, etc that utilises laid-down nanofibres. The devices may be provided by a fabrication process where nanofibres forming light emitting, sensing or guiding elements have been transferred to another substrate by the method according to the first aspect of the invention.

The method according to the present invention is advantageous for use in the production of optoelectric components or devices since the active elements may be provided on a first substrate enabling growth or production of the nanoscale element and afterwards transferred to a production substrate. The method may thereby bridge the gap often seen between specialised research on idealised model systems to commercial products. Further, it may render large-scale production cheap since it facilitates wafer-size production in a simple and reliable manner.

These and other aspects, features and/or advantages of the invention will be apparent from and elucidated with reference to the embodiments described hereinafter.

BRIEF DESCRIPTION OF THE DRAWINGS

Embodiments of the invention will be described, by way of example only, with reference to the drawings, in which.

DESCRIPTION OF PREFERRED EMBODIMENTS

Figure 1:
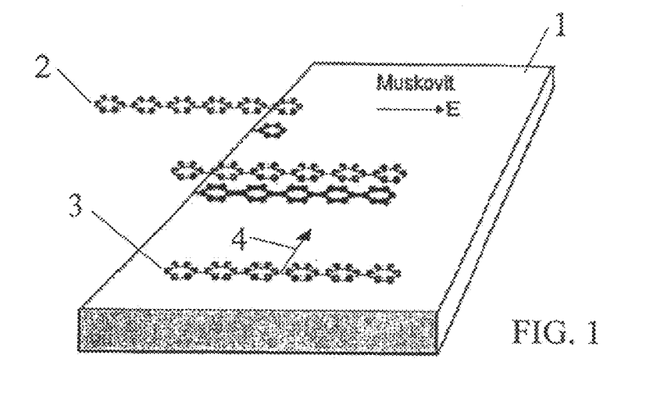
FIG. 1 illustrates schematically the growth of organic nanofibres on a template substrate.

FIG. 1 illustrates schematically the growth of organic nanofibres 2, 3 on a template substrate 1, or more specifically, the growth of phenylene nanofibres on a muscovite mica substrate.

Mica may be prepared so that an electric field is present in the surface, e.g. by cleavage in air and immediate transfer into a vacuum apparatus where it may be outgassed, e.g. at 410 K for 5 h.

The nanofibres presented in this section are made up of p-phenylene oligomers (p-nP) which are elongate molecules made of n benzene rings. It is however to be understood that any type of molecules within the scope of the present invention may be used. These molecules may grow in a self-organising way into organic nanofibres, the molecules grow in a direction perpendicular to the molecular axis, i.e. the molecules grow in a direction parallel to the surface plane, as indicated by the arrow marked with reference numeral 4. The fibres may be provided with a length of up to a few millimetres with a cross-section of a few hundreds nanometers. The size of the nanofibres can be controlled by implying proper conditions during the growth process.

The phenylene oligomers may be provided onto the mica surface at variable surface temperatures such as between 350 and 450 K, and with variable deposition rates, e.g. by means of a resistively heated oven with a nozzle at a deposition rate of ~0.02-0.5 Å/s. The size of the resulting nanofibres depends very much on the surface temperature. The surface temperature may further be controlled by means of irradiating a focussed low power laser on the surface in the growth region.

FIGS. 2A and B show two microscope images of aligned nanofibres 20, 21 grown on a mica substrate. The nanofibres were grown at a surface temperature of 356 K in connection with laser irradiation from a 0.5 W laser. The width of the nanofibres is around 200 nm and the density is between $10^5$ $cm^{-2}$ and $10^6$ $cm^{-2}$. The typical lengths of the nanofibres are indicated by the scale bars provided in the figures.

FIGS. 3A-C illustrate schematically and in a cross-sectional view the releasing process of the nanofibres 31 from the template substrate 30. The illustration is purely provided for illustrative purposes and does not necessarily represent the physical truth at the interface. FIGS. 3A and 3B illustrate two different embodiments where different amounts of liquid have been provided. In FIG. 3A only a small amount of liquid is provided so that at least the region 35 in the vicinity of the contact area between the individual nanofibres and the substrate is wetted by the liquid. In FIG. 3B a larger amount of liquid is provided, this is illustrated as the entire combined system comprising the nanofibres and the template substrate is wetted, however this is not necessarily the case. Energy is subsequently supplied to the combined system as illustrated in FIG. 3C. Energy may be supplied, e.g. by means of an UV light source 36 of irradiance 0.1-1 $W/cm^2$ at wavelengths 300-400 nm, irradiating 37 the sample between a few seconds and a few hundred seconds. Some of the supplied energy is absorbed in the contact region between the nanofibres and the template substrate, whereby the bonding of the nanofibres is weakened, possibly due to excitation of internal motions in the nanofibre, followed by introduction of molecules from the liquid in the contact region 34 between the nanofibres and the template surface. This is schematically illustrated in FIG. 3C by a lifting 34 of the nanofibres. However, this is only for illustrative purposes, the important feature is that the bonding between the nanofibres and the template substrate is weakened due to the execution of the process steps of the present invention.

FIGS. 4A-C illustrate schematically an embodiment of process steps of a transferring of the released nanofibres from the template substrate 30 to a target substrate 40. The template substrate is supporting nanofibres which have been released 41 is illustrated in FIG. 4A. The target surface 40 is brought into close contact so that the surface of the target substrate is brought into contact with the nanofibres and the liquid as illustrated in FIG. 4B. By contacting the two substrates together, the nanofibres are forming surface bonds to the target substrate and stick thereto. Upon separation of the two substrates the nanofibres are transferred to the target substrate. The nanofibres are transferred in a way so that both the geometrical orientation of the nanofibres on the template substrate is maintained on the target substrate, also the physical properties of the nanofibres are maintained in the transfer process. The target substrate may be any type of substrate, whereby nanofibres can be provided on a substrate on which growth of desired nanofibres may not be possible.

Another scenario for transferring the nanofibres to a target substrate can be envisioned. Instead of releasing the nanofibres before bringing the target substrate 40 in contact with the template substrate and solution, the target substrate can be brought into contact before the energy is supplied. This corresponds to bringing the target substrate 40 into contact in either FIG. 3A or FIG. 3B instead of in FIG. 3C. This means that the energy is supplied to the contact region in a step between FIGS. 4A and 4B. Upon separation of the two substrates, the nanofibres are transferred to the target substrate, as in FIG. 4C.

FIG. 5 illustrates schematically another embodiment of a transfer process. After the nanofibres have been released as described in connection with FIG. 3, additional liquid may be supplied to the substrate. The additional liquid may be provided in a liquid flow and the frictional forces arising from the flow may be sufficient for the nanofibres to be washed off. The liquid 51 containing the nanofibres may be collected in a container 52. A target substrate 40 may be dragged through, dipped, etc. in the liquid resulting in adhesion of nanofibres to the surface of the target substrate.

The nanofibres may however also be reconfigured in the liquid solution, by placing the nanofibres in the liquid solution between two objects, such as a wall of a container 52 and a sheet 53 that can be moved as shown by the arrow. The concentration of the nanofibres in the region between the two objects may be increased. Due to molecular interactions between the individual elongated nanofibres, the nanofibres will line up with a mutual mean separation depending upon the concentration of the nanofibres in the liquid. By slowly moving the target substrate through the liquid, the nanofibres can be provided to the substrate surface in an aligned way.

The liquid pressure may be probed 54 during the moving of the sheet 53. Since the nanofibre containing liquid may be an incompressible liquid, the liquid pressure will stay constant until a minimum mutual distance of separation of the nanofibres at the surface has been achieved, at this point the liquid pressure will start to rise. By slowly moving the target substrate through the liquid, a film of nanofibres can be formed on the surface of the target substrate.

Images of nanofibres which have been grown on a mica template substrate and subsequently transferred into a liquid solution are shown in FIGS. 6A and B. FIG. 6A shows a situation where the nanofibres have been transferred into the solution without rearranging the nanofibres, whereas for the nanofibres shown in FIG. 6B, the density of the nanofibres has been increased by the method as discussed in connection with FIG. 5, i.e. by compressing the nanofibres by moving sheet 53 close to the container wall.

Figure 7:
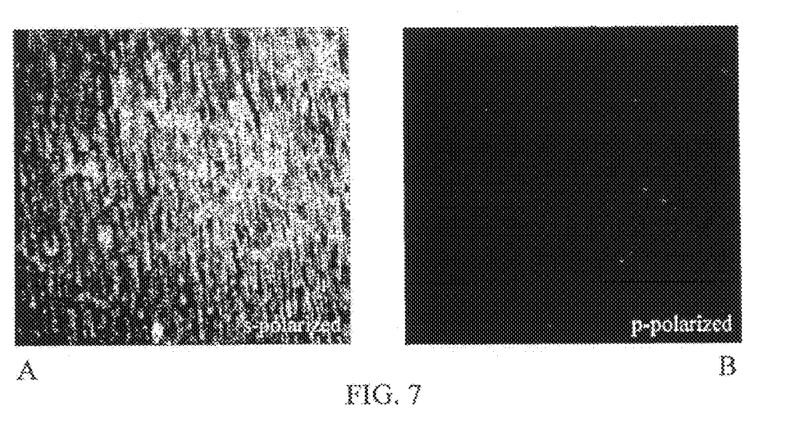
FIG. 7 shows images of a film of nanofibres which have been transferred from a liquid solution to a target substrate.

FIGS. 7A and B show images of a 50 nm thick film of nanofibres that has been transferred from a liquid solution to a target substrate. Here, the target substrate is a microscope glass plate, however it may be any type of substrate. The nanofibres are highly oriented as can be seen from polarisation measurements of the light emitted from the nanofibres, illustrated by FIGS. 7A and 7B. In FIG. 7A, the s-polarised light emitted from the nanofibres has been measured, whereas the p-polarised light emitted from the nanofibres has been measured in 7B. It is clear that the emitted light is s-polarised to a high degree, since virtually no p-polarised light is measured, indicating that the molecules in the transferred layer are well oriented. Measurement shows that more than 95% of the molecules in the transferred layer are well oriented. Such well-oriented optically active film may be very difficult if not impossible to obtain using other methods. And very importantly, the highly oriented film can be provided to any type of substrate—both single crystalline and non-crystalline substrates. It is a great advantage to be able to provide such highly oriented films to any type of substrate.

Figure 8:
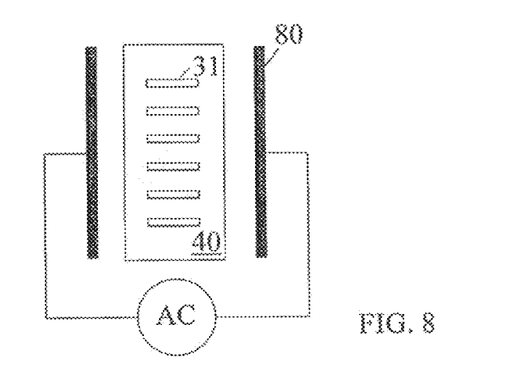
FIG. 8 illustrates schematically alignment of nanofibres by means of an AC generator.

The elongate nanofibres tend to align in a self-organising way, however, this alignment may suffer from a wide distribution, both in angle and mutual separation. Placing the released nanofibres in AC electric dipole field either before or after transfer to the target substrate may contribute to align the nanofibres even further. This can be implemented by placing the substrate and thereby the nanofibres in contact with the polar liquid between two electrodes 80 connected to an AC generator as illustrated in FIG. 8.

Figure 9:
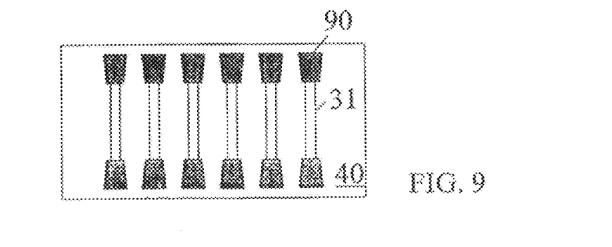
FIG. 9 illustrates nanofibres connected to conducting pads.

The transfer of the nanofibres to a target substrate may be a first step in a process of fabricating a device. The target substrate may e.g. be a semiconductor substrate, on which lithographic steps can be performed. FIG. 9 illustrates a device resulting from lay-down of nanofibres on a substrate, whereafter nanofibres can be connected to conducting pads 90, which again can be further connected to control circuitry, e.g. by conducting tracks such as wires. The nanofibres may e.g. be connected to a current generator capable of running a current through selected nanofibres, which may thereby emit light.

According to the further aspects, light emitting devices, light sensing devices, light guiding devices, etc utilising nanofibres may be fabricated using the lift-off procedure according to the invention.

As for light emitting or light sensing devices, the nanofibres can be luminescent molecule-specific elements which can be transferred onto a generic waveguiding platform. The excitation of the luminescent elements can be facilitated by evanescent waves by lay-down on the surface of a waveguide. The nanofibre film on the microscope glass plate of FIGS. 7A and B may constitute a light emitting or sensing device, wherein the glass plate serves as a waveguide. For the light emitting application, the device of FIG. 9 is an example of excitation by an electric current through the nanofibres. For the sensor application, detection of induced luminescence may be carried out in the far field or via the propagating waves. Such devices would represent an all-optical sensor.

As for the light guiding elements, nanofibres can be laid-down in patterns by patterning the growth on the template substrate and transferring nanofibres onto an embedding integrated photonic structure. The coupling of light to the nanofibre could occur via evanescent wave excitation, via matching a dedicated two-dimensional photonic band gap structure or via other known coupling techniques. The light guided by the nanofibre could e.g. be coupled to an organic ring resonator (a circularly bent nanofibre with appropriate dimensions) via evanescent coupling. The light could also be guided from a light emitting nanofibre (see above) to a nanofibre made of other organic molecules so as to change the colour of the guided light. Due to the dimensions of the nanofibres (especially their lateral dimensions or "flatness") and due to the substrate binding, coupling efficiency between nanofibres is generally very high.

Although the present invention has been described in connection with preferred embodiments, it is not intended to be limited to the specific form set forth herein. Rather, the scope of the present invention is limited only by the accompanying claims.

Reference is made to nanofibres, this reference is not intended to be limiting and should be construed to include at least rod-like shapes, needle-like shapes, such as any type of elongated or substantially elongated and bent objects. Further, the prefix nano should be construed broadly and at least to include sub-micrometer sized objects as is common in the field of nanotechnology.

In this section, certain specific details of the disclosed embodiment such as specific substrates, liquids, molecules, preparation conditions, as well as number and order of method steps, etc, are set forth for purposes of explanation rather than limitation, so as to provide a clear and thorough understanding of the present invention. However, it should be understood readily by those skilled in this art, that the present invention may be practised in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion.

The invention claimed is:

1. Method of releasing an ensemble of organic nanofibres from a template substrate, the method comprising the steps of:
   a) providing a dielectric template substrate,
   b) growing organic nanofibres on the template substrate, the nanofibres being elongate or bent aggregates of organic molecules,
   c) releasing the nanofibres from the template substrate by first providing a polar liquid to a surface of the template substrate so that the liquid is in liquid contact with the surface and the nanofibres,
   d) subsequently supplying energy to the combined system of nanofibres and liquid,
   e) bringing a target substrate into close contact with the template substrate, and
   f) separating the two substrates, whereby the nanofibres can be transferred to the target substrate,
      wherein optical and morphological properties of individual or an ensemble of nanofibres are conserved during transfer.

2. Method according to claim 1, wherein step e) occurs before step d).

3. Method according to claim 1, wherein an individual or an ensemble of nanofibres is contacted at one or more sections to electrode pads.

4. Method according to claim 1, further comprising the step of aligning the nanofibres.

5. Method according to claim 4, wherein the step of aligning the nanofibres comprises the steps of:
   placing the nanofibres between two electrodes capable of generating an electromagnetic field between the electrodes, and
   pplying an AC-field between the electrodes.

6. Method according to claim 1, wherein the template substrate is a substrate with a polar surface.

7. Method according to claim 1, wherein the template substrate is a mica substrate.

8. Method according to claim 1, wherein the organic nanofibres are optically active.

9. Method according to claim 1, wherein the organic nanofibres are optically active in the wavelength range of 300 nm to 600 nm.

10. Method according to claim 1, wherein the organic molecules of the nanofibres are para-phenylene oligomers.

11. Method according to claim 1, wherein the polar liquid is a liquid selected from the group of water and methanol.

12. Method according to claim 1, wherein the energy is provided in the form of ultra-violet light.

* * * * *